(12) United States Patent
Ozawa

(10) Patent No.: US 7,526,690 B2
(45) Date of Patent: Apr. 28, 2009

(54) SEMICONDUCTOR DEVICE-TESTING APPARATUS

(75) Inventor: Hirotaro Ozawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 739 days.

(21) Appl. No.: 11/072,237

(22) Filed: Mar. 7, 2005

(65) Prior Publication Data

US 2005/0166113 A1 Jul. 28, 2005

Related U.S. Application Data

(63) Continuation of application No. PCT/JP03/02445, filed on Mar. 3, 2003.

(51) Int. Cl.
*G01R 31/28* (2006.01)

(52) U.S. Cl. .................................... 714/719

(58) Field of Classification Search .................. None
See application file for complete search history.

(56) References Cited

U.S. PATENT DOCUMENTS

| 4,862,067 | A | * | 8/1989 | Brune et al. | 324/73.1 |
| 5,539,699 | A | * | 7/1996 | Sato et al. | 365/201 |
| 5,621,312 | A | * | 4/1997 | Achor et al. | 324/158.1 |
| 5,717,694 | A | * | 2/1998 | Ohsawa | 714/704 |
| 5,835,428 | A | * | 11/1998 | Kobayashi | 365/201 |
| 6,587,983 | B1 | * | 7/2003 | Nakayama | 714/736 |
| 6,920,582 | B2 | * | 7/2005 | Alt et al. | 714/30 |
| 2003/0023902 | A1 | * | 1/2003 | Frankowsky | 714/25 |
| 2003/0233604 | A1 | * | 12/2003 | Lin et al. | 714/718 |

FOREIGN PATENT DOCUMENTS

| JP | 04-236440 | | 8/1992 |
| JP | 04-285875 | * | 10/1992 |
| JP | 11-064454 | | 3/1999 |
| JP | 2000-163989 | | 6/2000 |
| JP | 2000-314762 | * | 10/2000 |
| JP | 2000-314762 | | 11/2000 |
| JP | 2001-236797 | | 8/2001 |

* cited by examiner

*Primary Examiner*—Jacques Louis-Jacques
*Assistant Examiner*—Steven D. Radosevich
(74) *Attorney, Agent, or Firm*—Arent Fox LLP

(57) ABSTRACT

A semiconductor device-testing apparatus which is capable of testing semiconductor devices simultaneously by a simple construction. A plurality of latch circuits latch output signals outputted from a plurality of DUTs having the same test signal "test" inputted thereto. A P-S conversion circuit sequentially outputs an expected value signal "exp", which is an expected value of signals that the DUTs should output in response to the test signal "test", and a plurality of latched signals, for a latch time period. An encoder circuit compares the latched signals with the expected value signal "exp". A memory stores the latched signals and the expected value signal "exp" delivered from the P-S conversion circuit, when the latched signals do not agree with the expected value signal "exp". A determination circuit determines the quality of each of the DUTs, based on the latched signals and the expected value signal "exp" stored in the memory.

8 Claims, 5 Drawing Sheets

US 7,526,690 B2

SEMICONDUCTOR DEVICE-TESTING APPARATUS

This application is a continuing application, filed under 35 U.S.C.§111(a), of International Application PCT/JP2003/002445, filed Mar. 3, 2003.

BACKGROUND OF THE INVENTION

1. Field of the Invention

This invention relates to a semiconductor device-testing apparatus, and more particularly to a semiconductor device-testing apparatus for testing a plurality of semiconductor devices simultaneously.

2. Description of the Related Art

Currently, an increasing number of semiconductor devices are designed and manufactured e.g. by ASIC (Application Specific Integrated Circuit) technology according to specifications demanded by users. In some cases, such semiconductor devices are subjected not only to tests by the designing and manufacturing sides, but also to tests, such as acceptance inspection, by the delivery side.

Semiconductor devices are generally mass-produced. Therefore, to improve the efficiency of testing semiconductor devices, there have been proposed semiconductor device-testing apparatuses which are each capable of testing a plurality of semiconductor devices simultaneously (see e.g. Japanese Laid-Open Patent Publication (Kokai) No. H11-64454 (page 4, and FIGS. 1 and 2)). Such semiconductor device-testing apparatuses are mainly used by the designing and manufacturing sides, for defect analysis, i.e. for analyzing which portion of a semiconductor device is defective.

On the delivery side, however, it is only required that the semiconductor device-testing apparatus is capable determining the quality of each semiconductor device, but it is not necessary that the apparatus has a high-functional testing capability. Therefore, there has been a demand for a semiconductor device-testing apparatus which is capable of testing semiconductor devices simultaneously by a simple construction.

SUMMARY OF THE INVENTION

The present invention has been made in view of the above points, and an object thereof is to provide a semiconductor device-testing apparatus which is capable of testing semiconductor devices simultaneously by a simple construction.

To attain the above object, the present invention provides a semiconductor device-testing apparatus for testing a plurality of semiconductor devices simultaneously. This semiconductor device-testing apparatus is characterized by comprising latch circuits that latch output signals outputted from a plurality of semiconductor devices under test which have a same test signal inputted thereto, an output circuit that sequentially outputs the latched output signals and an expected value of signals that the semiconductor devices under test should output in response to the test signal, for a latch time period, a comparison circuit that compares the latched output signals with the expected value, a memory that stores the output signals and the expected value outputted from the output circuit, when the output signals do not agree with the expected value, and a determination circuit that determines, based on the output signals and the expected value stored in the memory, quality of each of the semiconductor devices under test.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
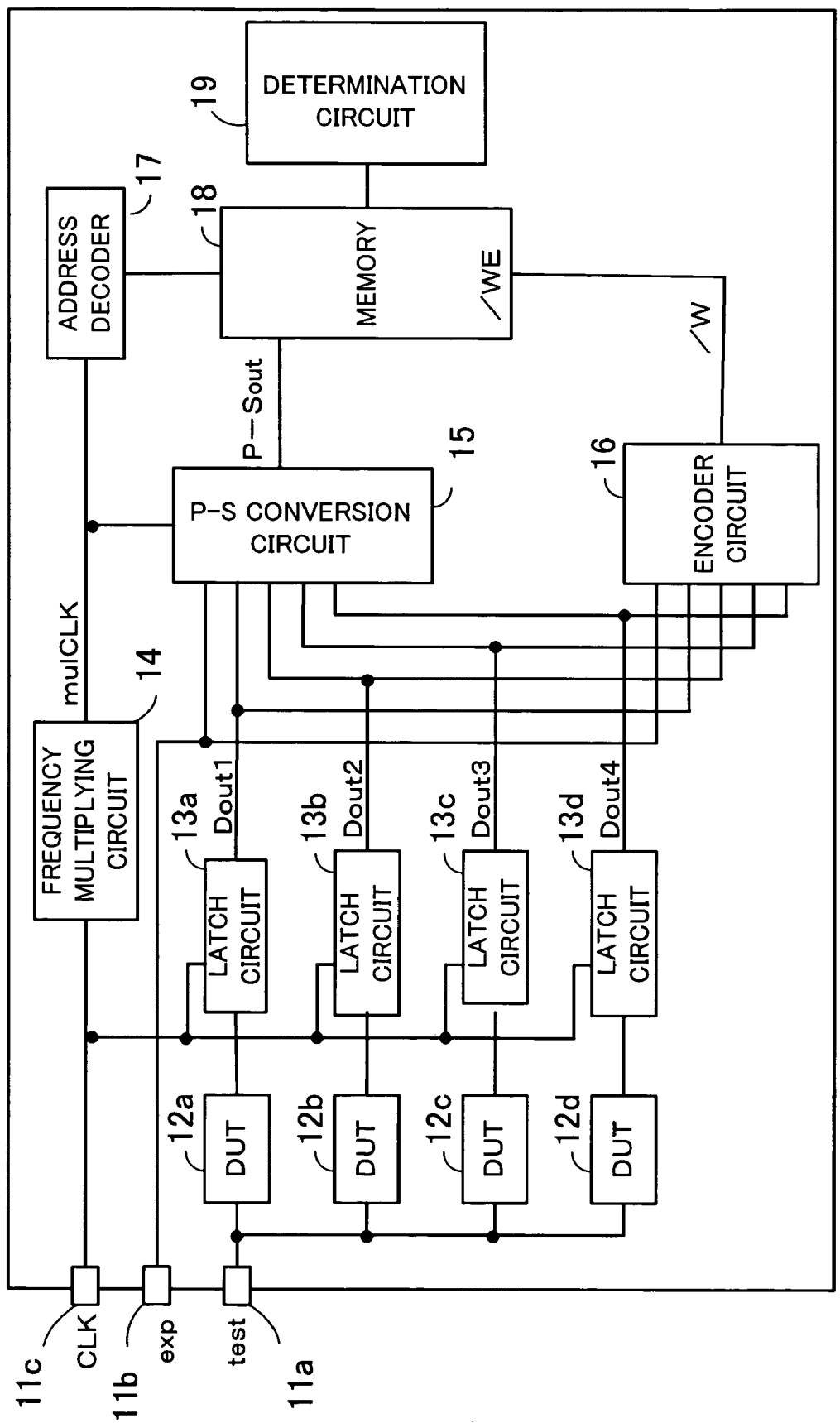
FIG. 1 is a diagram showing the circuit configuration of a semiconductor device-testing apparatus according to a first embodiment of the present invention.

The invention will now be described in detail with reference to the drawings showing an embodiment thereof. FIG. 1 is a diagram showing the circuit configuration of a semiconductor device-testing apparatus according to a first embodiment of the present invention. As shown in FIG. 1, the semiconductor device-testing apparatus is comprised of a test signal input terminal 11a, an expected value input terminal 11b, a clock input terminal 11c, semiconductor devices under test (DUTs) 12a to 12d, latch circuits 13a to 13d, a frequency multiplying circuit 14, a parallel-serial (P-S) conversion circuit 15, an encoder circuit 16, an address decoder 17, a memory 18, and a determination circuit 19.

A test signal "test" for performing functional tests of the DUTs 12a to 12d is inputted to the test signal input terminal 11a. The functional tests are performed by inputting H-level and L-level signals to the DUTs 12a to 12d to inspect whether or not the signals are outputted in states thereof corresponding to the functions of the DUTs 12a to 12d. The test signal input terminal 11a is connected to the inputs of the DUTs 12a to 12d, and the test signal "test" is delivered to the DUTs 12a to 12d.

An expected value signal "exp" is inputted to the expected value input terminal 11b. The expected value signal "exp" is a signal which the DUTs 12a to 12d should deliver in response to the test signal "test" when it is inputted to the DUTs 12a to 12d. The expected value signal "exp" inputted to the expected value input terminal 11b is delivered to the P-S conversion circuit 15 and the encoder circuit 16.

A clock CLK is inputted to the clock input terminal 11c. The clock CLK is a signal for synchronizing the test signal "test" and the expected value signal "exp". The clock CLK inputted to the clock input terminal 11c is delivered to the latch circuits 13a to 13d, and the frequency multiplying circuit 14.

The DUTs 12a to 12d are semiconductor devices to be subjected to the functional tests. The DUTs 12a to 12d are packaged, and inserted e.g. into a socket, not shown, provided in the semiconductor device-testing apparatus. When the DUTs 12a to 12d are inserted into the socket, input terminals of the DUTs 12a to 12d to which is inputted the test signal "test" for performing functional tests thereof are connected to the test signal input terminal 11a. Output terminals of the DUTs 12a to 12d for outputting output signals responsive to the test signal "test" are connected to the latch circuits 13a to 13d.

The latch circuits 13a to 13d latch the output signals delivered from the DUTs 12a to 12d, in synchronism with the clock CLK, and output the latched signals Dout1 to Dout4 to the P-S conversion circuit 15 and the encoder circuit 16. As described above, the clock CLK is the synchronizing signal for the test signal "test". Therefore, the latch circuits 13a to 13d latch the output signals that the DUTs 12a to 12d have delivered, for a time period during which the test signal "test" is maintained in one of the states thereof.

The frequency multiplying circuit 14 multiplies the clock CLK, and outputs a multiplied clock mulCLK. The frequency multiplying circuit 14 multiplies the clock CLK by a number obtained by adding 1 to the number of DUTs to be tested. In FIG. 1, since the number of the DUTs 12a to 12d is 4, the frequency multiplying circuit 14 outputs the multiplied clock mulCLK obtained by multiplying the clock CLK by 5. The multiplied clock mulCLK is outputted to the P-S conversion circuit 15 and the address decoder 17.

The expected value signal "exp" and the latched signals Dout1 to Dout4 are inputted to the P-S conversion circuit 15 simultaneously in parallel with each other. The P-S conversion circuit 15 sequentially outputs the inputted expected value signal "exp" and latched signals Dout1 to Dout4 from one output port in synchronism with the multiplied clock mulCLK. As described above, the multiplied clock mulCLK is a clock obtained by multiplying the clock CLK by a number obtained by adding 1 to the number of the DUTs to be tested. Therefore, the P-S conversion circuit 15 sequentially outputs the expected value signal "exp" and the latched signals Dout1 to Dout4 for a latch time period over which the latch circuits 13a to 13d latch the output signals outputted from the DUTs 12a to 12d in synchronism with the clock CLK. The P-S conversion circuit 15 delivers the expected value signal "exp" and the latched signals Dout1 to Dout4 as a converted signal P-Sout to the memory 18.

The expected value signal "exp" inputted to the expected value input terminal 11b, and the latched signals Dout1 to Dout4 outputted from the latch circuits 13a to 13d are inputted to the encoder circuit 16. The encoder circuit 16 compares each of the latched signals Dout1 to Dout4 with the expected value signal "exp". When even one of the latched signals Dout1 to Dout4 does not agree with the expected value signal "exp", the encoder circuit 16 delivers a write signal /W indicative of the fact to the memory 18.

It should be noted that in FIG. 1, when even one of the latched signals Dout1 to Dout4 does not agree with the expected value signal "exp", the encoder circuit 16 is assumed to output the write signal /W at L level.

The address decoder 17 counts up the address of the memory 18 in synchronism with the multiplied clock mulCLK.

The memory 18 includes a write enable terminal /WE for receiving the write signal /W from the encoder circuit 16. When receiving the write signal /W indicating that the latched signals Dout1 to Dout4 do not agree with the expected value signal "exp", at the write enable terminal /WE, the memory 18 stores the conversion signal P-Sout outputted from the P-S conversion circuit 15. Since the address of the memory 18 is counted up by the address decoder 17 in synchronism with the multiplied clock mulCLK, the expected value signal "exp" and the latched signals Dout1 to Dout4 (converted signal P-Sout) sequentially outputted from the P-S conversion circuit 15 are stored one by one in each of addresses of the memory 18. The memory 18 stores the same value as an initial value in all the addresses thereof.

It should be noted that in FIG. 1, when the write signal /W at L level is inputted to the write enable terminal /WE, the memory 18 stores the converted signal P-Sout outputted from the P-S conversion circuit 15.

The determination circuit 19 compares each of the latched signals Dout1 to Dout4 with the expected value signal "exp", stored in the memory 18, and determines that one or ones of the DUTs 12a to 12d corresponding to one or ones of the respective latched signals Dout1 to Dout4 which does/do not agree with the expected value signal "exp" is/are defective. As described above, the memory 18 stores the same value as an initial value in all the addresses thereof, and when any of the latched signals Dout1 to Dout4 is/are different from the expected value signal "exp", the memory 18 stores the expected value signal "exp" and the latched signals Dout1 to Dout4 one by one in the associated address counted up by the address decoder 17. Therefore, by comparing the latched signals Dout1 to Dout4 with the expected value signal "exp" with reference to the addresses, the determination circuit 19 can determine which of the DUTs 12a to 12d is/are defective.

Figure 2:
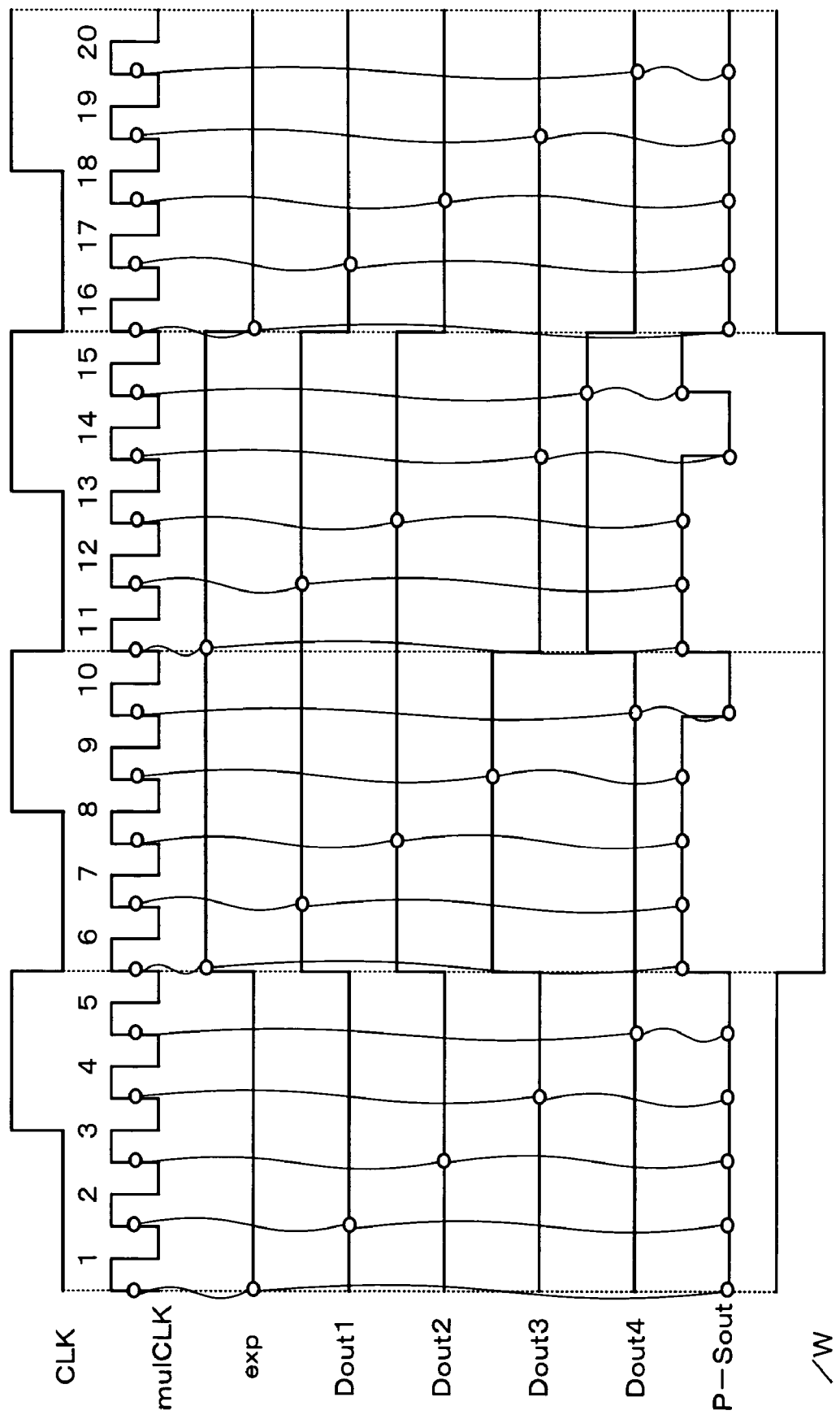
FIG. 2 is a timing diagram of the semiconductor device-testing apparatus in FIG. 1.

Hereinafter, the operation of the semiconductor device-testing apparatus shown in FIG. 1 will be described with reference to a timing diagram. FIG. 2 is the timing diagram for the semiconductor device-testing apparatus in FIG. 1.

In FIG. 2, CLK designates the clock CLK inputted to the clock input terminal 11c, and mulCLK designates the multiplied clock mulCLK multiplied by the frequency multiplying circuit 14. Each of numbers shown on the multiplied clock mulCLK designates a clock count of the multiplied clock mulCLK. In FIG. 1, since the frequency multiplying circuit 14 multiplies the clock CLK by a number obtained by adding 1 to the number of the DUTs to be tested, the frequency of the multiplied clock mulCLK is 5 times as high as that of the clock CLK. Exp designates the expected value signal "exp" inputted to the expected value input terminal 11b. Dout1 to Dout4 designate the latched signals Dout1 to Dout4 outputted from the latch circuits 13a to 13d. P-Sout designates the converted signal P-Sout outputted from the P-S conversion circuit 15. /W designates the write signal /W outputted from the encoder circuit 16.

The test signal "test" inputted to the test signal input terminal 11a is inputted to the DUTs 12a to 12d. The DUTs 12a to 12d output the output signals in response to the inputted test signal "test".

As shown in FIG. 2, the latch circuits 13a to 13d latch the output signals outputted from the DUTs 12a to 12d during one period of the clock CLK, and output the latched signals Dout1 to Dout4.

The latched signals Dout1 to Dout4 delivered from the latch circuits 13a to 13d are outputted to the P-S conversion circuit 15 and the encoder circuit 16. To the P-S conversion circuit 15 and the encoder circuit 16 are also inputted the expected value signal "exp" inputted to the expected value input terminal 11b.

The P-S conversion circuit 15 sequentially outputs the inputted expected value signal "exp" and latched signals Dout1 to Dout4 in synchronism with the multiplied clock mulCLK outputted from the frequency multiplying circuit 14. In FIG. 2, the P-S conversion circuit 15 outputs the expected value signal "exp" as the converted signal P-Sout at a first clock of the multiplied clock mulCLK. The P-S conversion circuit 15 outputs the latched signal Dout1 as the converted signal P-Sout at a second clock of the multiplied clock mulCLK. The P-S conversion circuit 15 outputs the latched signal Dout2 as the converted signal P-Sout at a third clock of the multiplied clock mulCLK. The P-S conversion circuit 15 outputs the latched signal Dout3 as the converted signal P-Sout at a fourth clock of the multiplied clock mulCLK. The P-S conversion circuit 15 outputs the latched signal Dout4 as the converted signal P-Sout at a fifth clock of the multiplied clock mulCLK. In the same manner, thereafter, the P-S conversion circuit 15 sequentially outputs the expected value signal "exp" and the latched signals Dout1 to Dout4 as the converted signal P-Sout in synchronism with the multiplied clock mulCLK.

The encoder circuit 16 compares each of the latched signals Dout1 to Dout4 with the expected value signal "exp". When even one of the latched signals Dout1 to Dout4 does not agree with the expected value signal "exp", the encoder circuit 16 delivers the write signal /W at L level to the memory 18. In FIG. 2, the write signal /W is at H level during the first to fifth clocks of the multiplied clock mulCLK, since the latched signals Dout1 to Dout4 agree with the expected value signal "exp". The write signal /W is at L level during the sixth to tenth clocks of the multiplied clock mulCLK, since the expected value signal "exp" does not agree with the latched signal Dout4. The write signal /W is at L level during the eleventh to fifteenth clocks of the multiplied clock mulCLK, since the latched signal Dout3 does not agree with the expected value signal "exp". The write signal /W is at H level during the sixteenth to twentieth clocks of the multiplied clock mulCLK, since the latched signals Dout1 to Dout4 agree with the expected value signal "exp".

When receiving the write signal /W at L level from the encoder circuit 16, the memory 18 stores the converted signal P-Sout (the expected value signal "exp" and the latched signals Dout1 to Dout4) delivered from the P-S conversion circuit 15. That is, the memory 18 stores the expected value signal "exp" and the latched signals Dout1 to Dout4, only when any of the DUTs 12a to 12d have delivered a signal or signals different from the expected value signal "exp". Since the address of the memory 18 is counted up by the address decoder 17 in synchronism with the multiplied clock mulCLK, the expected value signal "exp" and the latched signals Dout1 to Dout4 are stored one by one in each of the addresses of the memory 18.

The determination circuit 19 compares each of the latched signals Dout1 to Dout4 with the expected value signal "exp", stored in the memory 18, and determines whether or not the DUTs 12a to 12d are defective devices. For example, in FIG. 2, the expected value signal "exp" and the latched signal Dout4 do not agree with each other during the sixth to tenth clocks of the multiplied clock mulCLK, and hence the expected value signal "exp" and the latched signals Dout1 to Dout4 are stored in the memory 18. The determination circuit 19 compares the expected value signal "exp" and the latched signals Dout1 to Dout4, stored in the memory 18, with each other, and determines that the DUT 12d having delivered the output signal corresponding to the latched signal Dout4 is defective. Similarly, the determination circuit 19 determines that the DUT 12c, which has delivered the output signal (latched signal Dout3) different from the expected value signal "exp" during the eleventh to fifteenth clocks of the multiplied clock mulCLK, is defective.

As described hereinabove, in the semiconductor device-testing apparatus according to the first embodiment, the latch circuits 13a to 13d latch the output signals delivered from the DUTs 12a to 12d; the P-S conversion circuit 15 sequentially delivers the latched signals Dout1 to Dout4 latched and outputted by the latch circuits 13a to 13d and the expected value signal "exp" (as converted signal P-Sout); the encoder circuit 16 compares the latched signals Dout1 to Dout4 with the expected value signal "exp". When the latched signals Dout1 to Dout4 do not agree with the expected value signal "exp", the memory 18 stores the converted signal P-Sout delivered from the P-S conversion circuit 15, and the determination circuit 19 determines, based on the latched signals Dout1 to Dout4 and the expected value signal "exp", stored in the memory 18, the quality of each of the DUTs 12a to 12d. Due to this configuration, it is possible to test a plurality of the DUTs 12a to 12d simultaneously by a simple construction.

Further, by simplifying the construction of the semiconductor device-testing apparatus, the manufacturing costs of the apparatus can be reduced, which leads to a decrease in testing costs of semiconductor devices.

It should be noted that although in FIG. 2, the latched signals Dout1 to Dout4 are 1-bit signals, they may be multi-bit signals. In this case, the P-S conversion circuit 15 sequentially outputs the latched multi-bit signals Dout1 to Dout4, one by one, in a parallel form with the bits of each of the signals Dout1 to Dout4 being delivered parallel with each other. The memory 18 stores the multi-bit latched signals Dout1 to Dout4 one by one in each address thereof.

Figure 3:
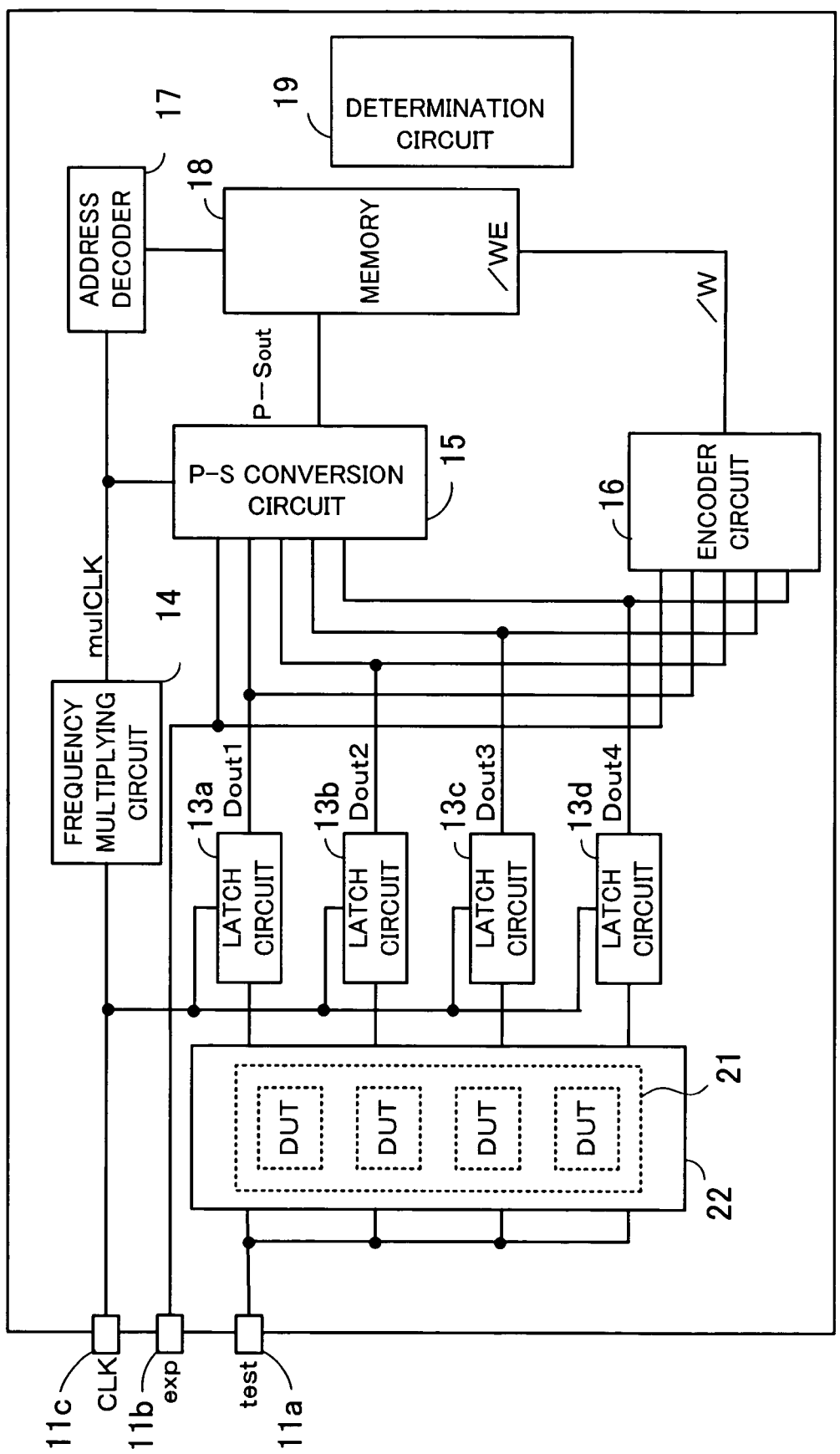
FIG. 3 is a diagram showing the circuit configuration of a semiconductor device-testing apparatus according to a second embodiment of the present invention.

Next, a description will be given of a second embodiment of the present invention. FIG. 3 is a diagram showing the circuit configuration of a semiconductor device-testing apparatus according to the second embodiment. In the second embodiment, a defective one of semiconductor devices formed on a wafer is determined. In FIG. 3, component elements identical to those in FIG. 1 are designated by identical reference numerals, and detailed description thereof is omitted.

Figure 4:
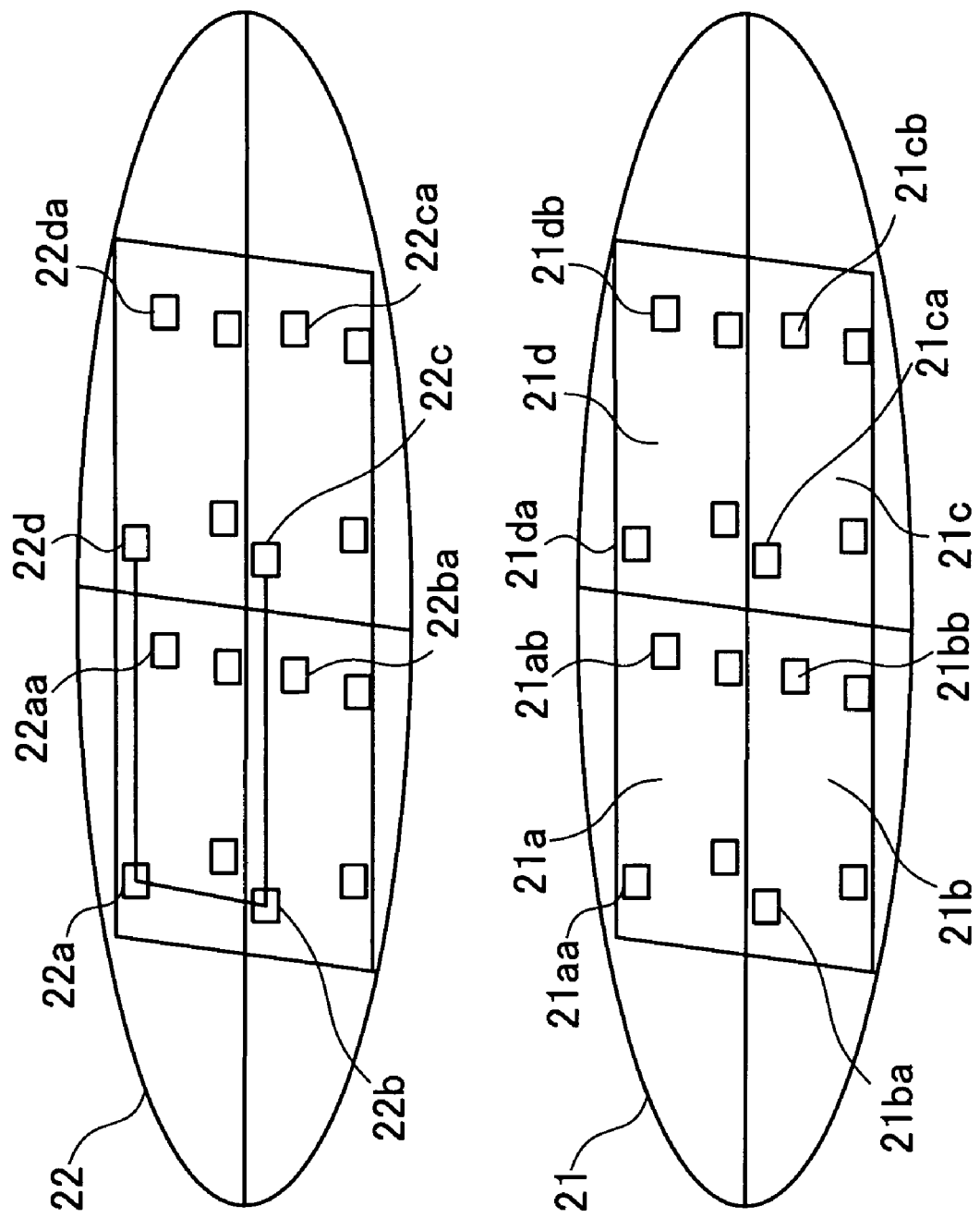
FIG. 4 is a diagram showing the details of a wafer and a jig wafer appearing in FIG. 3.

In FIG. 3, there are shown the wafer 21 and a jig wafer 22. The wafer 21 has semiconductor devices (DUTs) to be tested, formed thereon. The jig wafer 22 has terminals which are brought into contact with the input terminals and output terminals of the DUTs when the jig wafer 22 is overlaid on the wafer 21. The terminals of the jig wafer 22 that are brought into contact with the input terminals of the DUTs are connected to the test signal input terminal 11a, and the terminals of the jig wafer 22 that are brought into contact with the output terminals of the DUTs are connected to the respective latch circuits 13a to 13d. FIG. 4 is a diagram showing the details of the wafer and the jig wafer appearing in FIG. 3.

As shown in FIGS. 3 and 4, the wafer 21 has the DUTs 21a to 21d formed thereon. The DUTs 21a to 21d have input terminals 21aa, 21ba, 21ca, and 21da to which the test signal "test" is inputted. Further, the DUTs 21a to 21d have output terminals 21ab, 21bb, 21cb, and 21db from which output signals are delivered in response to the test signal "test".

The jig wafer 22 has the test input terminals 22a to 22d which are brought into contact with the input terminals 21aa to 21da of the DUTs 21a to 21d when the jig wafer 22 is overlaid on the wafer 21. Further, the jig wafer 22 has test output terminals 22aa to 22da which are brought into contact with the output terminals 21ab to 21db of the DUTs 21a to 21d, when the jig wafer 22 is overlaid on the wafer 21.

The test input terminals 22a to 22d of the jig wafer 22 are short-circuited with each other. Therefore, e.g. by connecting a probe connected to the test signal input terminal 11a appearing in FIG. 3 to one of the test input terminals 22a to 22d, the test signal "test" is inputted to all the test input terminals 22a to 22d.

Further, e.g. by connecting probes connected to the inputs of the latch circuits 13a to 13d appearing in FIG. 3 to the test output terminals 22aa to 22da, it is possible to output the output signals from the DUTs 21a to 21d to the latch circuits 13a to 13d.

As described above, in the semiconductor device-testing apparatus according to the second embodiment, by overlaying the jig wafer 22 on the wafer 21, the input terminals 21aa to 21da of the DUTs 21a to 21d are brought into contact with the test input terminals 22a to 22d of the jig wafer 22, which are short-circuited with each other, and the output terminals 21ab to 21db of the DUTs 21a to 21d are brought into contact with the test output terminals 22aa to 22da of the jig wafer 22, respectively. Then, the test signal input terminal 11a is connected to one of the test input terminals 22a to 22d of the jig wafer 22 to input the test signal "test", and the inputs of the latch circuits 13a to 13d are connected to the test output terminals 22aa to 22da of the jig wafer 22, respectively, to output the output signals from the DUTs 21a to 21d to the latch circuits 13a to 13d. With this configuration, it is possible to easily input the test signal "test" to the DUTs 21a to 21d formed on the wafer 21, and output the output signals delivered from the DUTs 21a to 21d to the latch circuits 13a to 13d. Further, it is possible to prevent the wafer 21 from being damaged.

It should be noted that although in the above description, the probes are connected to the jig wafer 22 to thereby connect the jig wafer 22 to the test signal input terminal 11a and the latch circuits 13a to 13d, this is not limitative, but the test signal input terminal 11a and the latch circuits 13a to 13d may be connected and fixed to the jig wafer 22 with lead wires.

Figure 5:
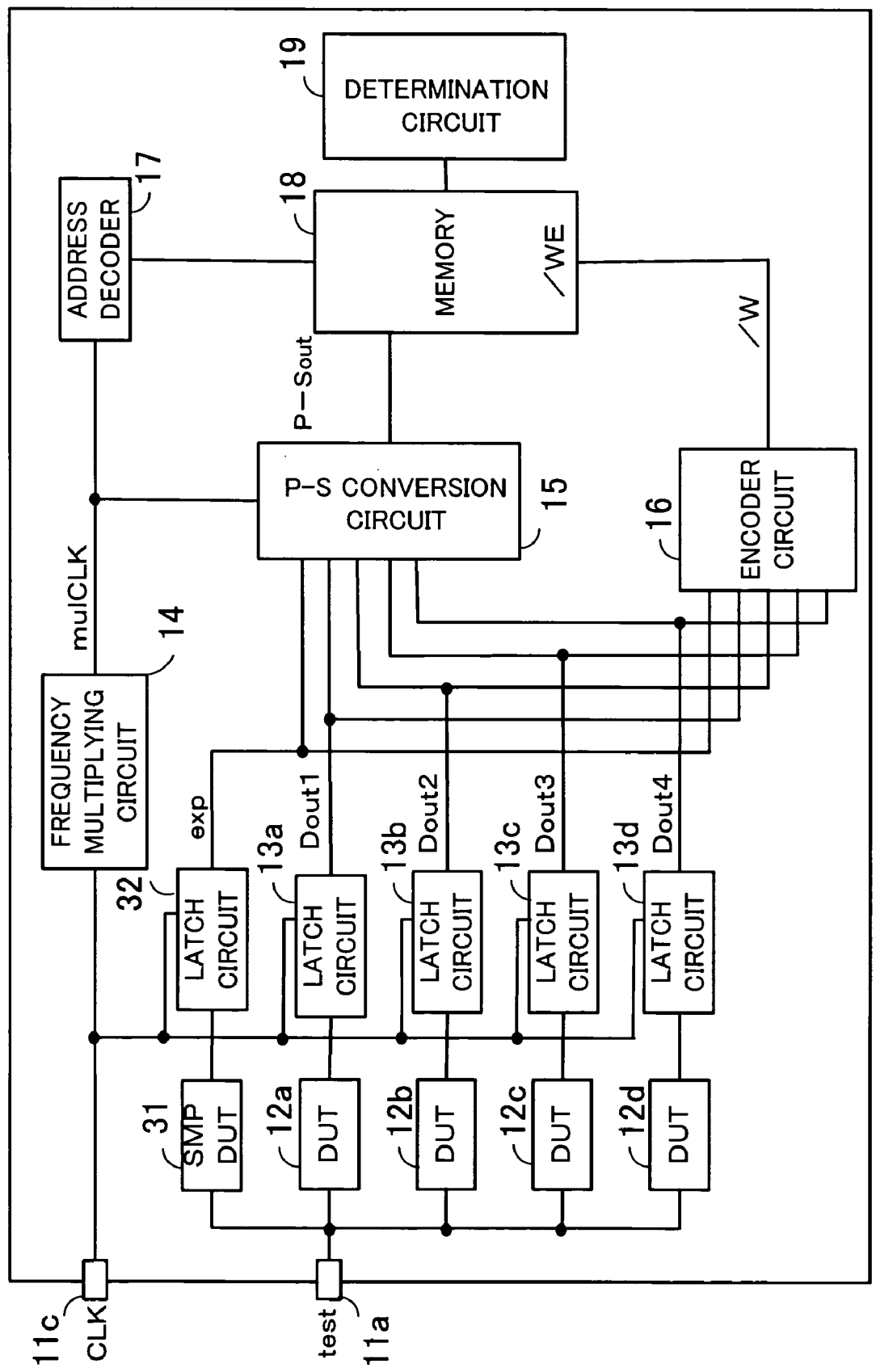
FIG. 5 is a diagram showing the circuit configuration of a semiconductor device-testing apparatus according to a third embodiment of the present invention.

Next, a description will be given of a third embodiment of the present invention. FIG. 5 is a diagram showing the circuit configuration of a semiconductor device-testing apparatus according to the third embodiment. In the third embodiment, the same test signal "test" as the test signal "test" inputted to semiconductor devices to be tested is inputted to a semiconductor device which has been determined as a non-defective semiconductor device in advance, and an output signal outputted from the non-defective semiconductor device is used as the expected value signal "exp". In FIG. 5, component elements identical to those in FIG. 1 are designated by identical reference numerals, and detailed description thereof is omitted.

The semiconductor device-testing apparatus shown in FIG. 5 includes a semiconductor sample device under test (SMPDUT) 31 determined as a non-defective device, and a latch circuit 32 for latching an output signal outputted from the SMPDUT 31, in place of the expected value input terminal 11b appearing in FIG. 1.

The input of the SMPDUT 31 is connected to the test signal input terminal 11a and the same test signal "test" as inputted to the DUTs 12a to 12d is inputted to the SMPDUT 31. Since the SMPDUT 31 is a non-defective semiconductor device, the output signal outputted therefrom has an expected value of a signal that the DUTs 12a to 12d should output in response to the test signal "test".

The latch circuit 32 latches the output signal outputted from the SMPDUT 31, in synchronism with the clock CLK inputted to the clock input terminal 11c. A signal delivered from the latch circuit 32 is outputted to the P-S conversion circuit 15 and the encoder circuit 16 as the expected value signal "exp".

In the same manner as described with reference to FIG. 1, the P-S conversion circuit 15 sequentially delivers the expected value signal "exp" and the latched signals Dout1 to Dout4 to the memory 18.

In the same manner described with reference to FIG. 1, the encoder circuit 16 compares each of the latched signals Dout1 to Dout4 with the expected value signal "exp" delivered from the latch circuit 32, and outputs the results of the comparison to the memory 18.

As described above, the semiconductor device-testing apparatus according to the third embodiment is configured such that similarly to the DUTs 12a to 12d to be tested, the test signal "test" is inputted to the SMPDUT 31 determined as a non-defective device in advance, and the output signal outputted from the SMPDUT 31 is used as the expected value signal "exp". This also makes it possible to test the DUTs 12a to 12d simultaneously by a simple construction.

As described heretofore, in the present invention, the latch circuits latch output signals outputted from a plurality of semiconductor devices under test having the same test signal inputted thereto; the output circuit sequentially outputs an expected value and the latched output signals for a latch time period; and the comparison circuit compares the output signals with the expected value. When the output signals and the expected value do not agree with each other, the memory stores the output signals outputted from the output circuit and the expected value, and the determination circuit determines, based on the output signals and expected value stored in the memory, the quality of the semiconductor devices under test. This makes it possible to test a plurality of semiconductor devices simultaneously by a simple construction.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device-testing apparatus for testing a plurality of semiconductor devices simultaneously, comprising:
    latch circuits that latch output signals outputted from a plurality of semiconductor devices under test which have a same test signal inputted thereto;
    an output circuit that sequentially outputs the latched output signals and an expected value of signals that the semiconductor devices under test outputs in response to the test signal, for a latch time period;
    a comparison circuit that compares the latched output signals with the expected value;
    a memory that stores the output signals and the expected value outputted from said output circuit, when the output signals do not agree with the expected value; and
    a determination circuit that determines, based on the output signals and the expected value stored in said memory, a quality of each of the semiconductor devices under test.

2. The semiconductor device-testing apparatus according to claim 1, wherein the semiconductor devices under test are formed on a wafer,
    the semiconductor device-testing apparatus includes a jig substrate that has test input terminals for inputting the test signal and test output terminals for outputting the out signals to said latch circuits, said test input terminals and said test output terminals being brought into contact with input terminals and output terminals of the semiconductor devices under test, respectively, when said jig is overlaid on the wafer.

3. The semiconductor device-testing apparatus according to claim 2, wherein said test input terminals are short-circuited with each other.

4. The semiconductor device-testing apparatus according to claim 1, wherein the semiconductor devices under test include a non-defective one, and wherein said comparison circuit compares a signal delivered from the non-defective semiconductor device with the output signals of the semiconductor devices under test except the non-defective semiconductor device, by using the signal as the expected value.

5. The semiconductor device-testing apparatus according to claim 1, further includes a frequency multiplying circuit that delivers a multiplied clock obtained by multiplying a clock signal in synchronism with which said latch circuits operate, by a number obtained by adding 1 to the number of the semiconductor devices under test, and wherein said output circuit sequentially delivers the output signals and the expected value in synchronism with the multiplied clock.

6. The semiconductor device-testing apparatus according to claim 5, further includes an address decoder that counts up an address of said memory based on the multiplied clock.

7. The semiconductor device-testing apparatus according to claim, 1, wherein said determination circuit determines whether or not the expected value stored in said memory agrees with each of the output signals stored in said memory.

8. The semiconductor device-testing apparatus according to claim 6, wherein said memory stores a same value as an initial value in all the addresses thereof.

* * * * *